United States Patent
Abe et al.

(10) Patent No.: US 9,190,232 B2
(45) Date of Patent: Nov. 17, 2015

(54) TANK-TYPE CIRCUIT BREAKER

(75) Inventors: Junichi Abe, Tokyo (JP); Shinji Sato, Tokyo (JP); Tomoko Tanabe, Tokyo (JP); Naoaki Inoue, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/233,305

(22) PCT Filed: Aug. 24, 2012

(86) PCT No.: PCT/JP2012/071397
§ 371 (c)(1),
(2), (4) Date: Jan. 16, 2014

(87) PCT Pub. No.: WO2013/035547
PCT Pub. Date: Mar. 14, 2013

(65) Prior Publication Data
US 2014/0166622 A1    Jun. 19, 2014

(30) Foreign Application Priority Data
Sep. 7, 2011    (JP) .................................. 2011-194632

(51) Int. Cl.
*H01H 33/26* (2006.01)
*H02B 13/065* (2006.01)
(Continued)

(52) U.S. Cl.
CPC ............. *H01H 33/26* (2013.01); *H01H 33/668* (2013.01); *H02B 13/0655* (2013.01); *G01R 31/1227* (2013.01)

(58) Field of Classification Search
CPC ......... H01H 33/12; H01H 33/66; H01H 9/00; H01R 13/5213; H01R 13/501; H01R 13/447; H01R 13/6273

USPC ................................. 218/118; 200/144, 308
See application file for complete search history.

(56) References Cited

U.S. PATENT DOCUMENTS 3,839,612 A * 10/1974 Badey et al. ....................... 218/4
4,027,125 A * 5/1977 Peek et al. ....................... 218/44
(Continued)

FOREIGN PATENT DOCUMENTS

CN        1340718 A        3/2002
CN        1926734 A        3/2007
(Continued)

OTHER PUBLICATIONS

International Search Report issued Sep. 18, 2012, in PCT/JP2012/071397, filed Aug. 24, 2012.
(Continued)

*Primary Examiner* — Truc Nguyen
(74) *Attorney, Agent, or Firm* — Oblon, McClelland, Maier & Neustadt, L.L.P.

(57) ABSTRACT

Capacitors (5a, 5b) are provided in the insulators of bushings (4a, 4b), respectively. One ends of the capacitors (5a, 5b) are connected to central conductors (3a, 3b) side, and the other ends are connected to a tank (1) side at the ground potential. When a discharge signal from the outside of the tank (1) reaches the capacitors (5a, 5b) through the central conductors (3a, 3b), the capacitors (5a, 5b) work as a filter to attenuate and prevent the signal in the frequency band of the discharge waveform from propagating to the inside of the tank (1). When an antenna (7) placed in the tank (1) receives a signal in the frequency band of the discharge waveform, a discharge detection unit (20) determines that a discharge inside the tank has been detected.

7 Claims, 4 Drawing Sheets

(51) Int. Cl.
*H01H 33/668* (2006.01)
*G01R 31/12* (2006.01)

(56) References Cited

U.S. PATENT DOCUMENTS

| | | | | |
|---|---|---|---|---|
| 4,315,119 | A | * | 2/1982 | Kishi et al. .................. 218/4 |
| 6,307,172 | B1 | * | 10/2001 | Bolin et al. .................. 218/155 |
| 2007/0119818 | A1 | * | 5/2007 | Meinherz ...................... 218/13 |
| 2011/0000772 | A1 | * | 1/2011 | Hanai et al. .................. 200/308 |
| 2012/0261383 | A1 | * | 10/2012 | Bose et al. .................... 218/52 |

FOREIGN PATENT DOCUMENTS

| | | |
|---|---|---|
| JP | 53-44773 | 10/1978 |
| JP | 59-160924 | 9/1984 |
| JP | 61-179015 | 8/1986 |
| JP | 1-235105 | 9/1989 |
| JP | 1-235865 | 9/1989 |
| JP | 2-203284 | 8/1990 |
| JP | 3-57977 | 3/1991 |
| JP | 5-99977 | 4/1993 |
| JP | 5-32993 | 8/1993 |
| JP | 6-201755 | 7/1994 |
| JP | 7-231558 | 8/1995 |
| JP | 2000-221229 | 8/2000 |
| JP | 4170014 | 10/2008 |
| JP | 4512042 | 7/2010 |
| JP | 2010-210574 | 9/2010 |

OTHER PUBLICATIONS

Combined Chinese Office Action and Search Report issued Mar. 31, 2015 in Patent Application No. 201280036026.0 (with English Translation and English Translation of Categories of Cited Documents).

* cited by examiner

FREQUENCY(MHz)

TANK-TYPE CIRCUIT BREAKER

TECHNICAL FIELD

The present invention relates to a tank-type circuit breaker having discharge detection capability.

BACKGROUND ART

A vacuum circuit breaker includes a stationary contact point and a moving contact point that is placed opposite the stationary contact point. The stationary contact point and the moving contact point are placed in a vacuum chamber in which vacuum is maintained around the contact points. With the contact points of the vacuum circuit breaker closed to cause current to flow in a main circuit conductor, when the contact points of the vacuum circuit breaker are opened to interrupt current flowing in the main circuit, if the vacuum degree in the vacuum chamber is high, high arc-suppression capability of vacuum causes current to be interrupted. However, if the vacuum degree in the vacuum chamber decreases due to factors such as a crack in the vacuum chamber, a discharge of gas molecule adsorbed to a metal or insulator, as well as a transmission of atmospheric gas, opening the contact points may cause breakdown to prevent the interruption of current, which may damage the equipment in the worst case. Thus, in order to know what is going on in the vacuum circuit breaker for preventing the breaker and its peripheral devices from being damaged, a vacuum degree deterioration monitoring device for determining whether or not the vacuum degree in the vacuum chamber has deteriorated has been under development.

For example, in existing literatures, a method is disclosed in which the normality of the vacuum degree is determined by detecting, using an antenna mounted in the tank-type circuit breaker, an electromagnetic wave caused by a discharge due to vacuum degree deterioration resulting in withstand voltage reduction (PTL 1). Furthermore, in one discharge detection method, a metal electrode placed in a bushing is used as an antenna to enable detection of a wide-range frequency signal (PTL 2). Furthermore, a method is described in which a discharge location is detected using the time difference of a signal received by two or more antennas mounted in the breaker (PTL 3).

Furthermore, a method is described in which a conductor is placed in a bushing to receive a discharge signal (PTL 4).

CITATION LIST

Patent Literature

PTL 1: JP-A-59-160924
PTL 2: Japanese Patent No. 4512042
PTL 3: Japanese Patent No. 4170014
PTL 4: JP-A-2-203284

SUMMARY OF INVENTION

Technical Problem

A conventional vacuum degree monitoring device (PTL 1) and a partial discharge detection device (PTL 2) cannot determine whether a detected discharge is an internal discharge that has occurred inside the breaker or an external discharge that has propagated from the outside through a central conductor. So, there may be a case in which, when a signal caused by a discharge is received, the vacuum degree of a vacuum valve in the breaker is checked with no problem detected, but, it turns out to be due to a discharge outside the breaker. This raises a problem of taking time to determine the discharge location.

Furthermore, detecting a discharge location from the time difference of a discharge signal received by two or more antennas as in a conventional partial discharge detection device (PTL 3) needs calculation of the time difference in the level of ns (nanosecond), which raises a problem of requiring a GHz-level oscillator and a high-performance and high-cost processing device for calculating the time difference.

In order to solve the above problem, it is an object of the present invention to provide a tank-type circuit breaker having discharge detection capability of, in performing vacuum degree monitoring and discharge detection, detecting a signal caused by a discharge inside the tank and not detecting a signal caused by a discharge outside the tank.

Solution to Problem

A tank-type circuit breaker in accordance with the invention includes: a tank filled with an insulating medium; a current interruption unit placed in the tank; first and second bushings connected to the input and output sides of the current interruption unit, respectively, and placed across the outside and inside of the tank; first and second low-pass filters placed around central conductors of the first and second bushings, respectively, for attenuating an external discharge signal in a discharge frequency band propagating from the outside of the tank; an antenna placed in the tank for receiving a discharge signal in the discharge frequency band; and a discharge detection unit for performing arithmetic processing on the discharge signal received by the antenna to detect a discharge inside the tank.

Advantageous Effects of Invention

According to the tank-type circuit breaker of the invention, the first and second low-pass filters are provided to attenuate an external discharge signal in the discharge frequency band propagating from the outside of the tank, so, in performing vacuum degree monitoring and discharge detection, the antenna for receiving a discharge signal in the discharge frequency band is capable of detecting a signal caused by a discharge inside the tank and attenuating and not detecting a signal caused by a discharge outside the tank.

Another object, feature, aspect and effect of the invention will be apparent from the following detailed description of the invention with reference to the drawings.

DESCRIPTION OF EMBODIMENTS

First Embodiment

Figure 1:
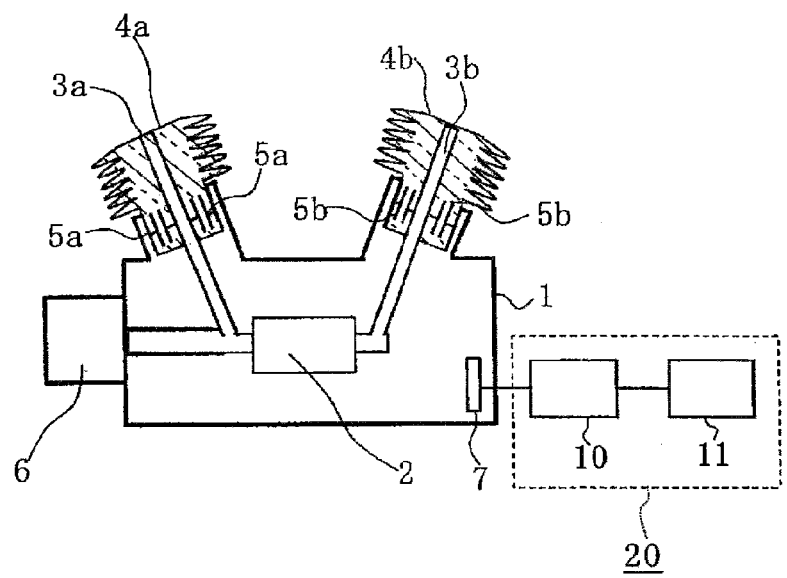
FIG. 1 A side sectional view of a tank-type circuit breaker of a first embodiment of the invention.

FIG. 1 is a schematic diagram showing a side sectional view of a tank-type circuit breaker in accordance with a first embodiment. Referring to FIG. 1, the tank-type circuit breaker includes: a tank 1 filled with an insulative medium; a current interruption unit 2 placed in the tank 1; first and second bushings 4a and 4b connected to the input and output sides of the current interruption unit 2, respectively, and placed across the outside and inside of the tank 1; first and second low-pass filters (corresponding to capacitors 5a and 5b) placed in the insulators around central conductors (corresponding to first and second central conductors 3a and 3b) of the first and second bushings 4a and 4b, respectively, for causing an external discharge signal in a discharge frequency band propagating from the outside of the tank 1 to propagate to the tank 1 side to be attenuated; an antenna 7 placed in the tank 1 for receiving a discharge signal in the discharge frequency band; and a discharge detection unit 20 for performing arithmetic processing on the discharge signal received by the antenna 7 to detect a discharge inside the tank 1.

In this tank-type circuit breaker, the tank 1 at the ground potential contains: the central conductors 3a and 3b passing through the insulators of the first and second bushings 4a and 4b for allowing current to flow; the current interruption unit 2 for interrupting current; and a drive unit 6 for driving the current interruption unit 2, and is filled with an insulating gas. For the insulating gas, for example, sulfur hexafluoride ($SF_6$), carbon dioxide ($CO_2$), trifluoromethane iodide ($CF_3I$), nitrogen ($N_2$), oxygen ($O_2$), methane tetrafluoride ($CF_4$), argon (Ar), helium (He), a mixed gas of at least two of them or the like is used. For the current interruption unit 2, for example, a gas circuit breaker, a vacuum circuit breaker, an oil circuit breaker or the like is used.

The tank 1 has a structure of horizontal cylinder as a basic structure and is made of a conductive material such as stainless and aluminum. The tank 1 also includes the bushings 4a and 4b (corresponding to the first and second bushings) in a plurality of areas connected to an external conducting path. The bushings 4a and 4b include as an component: the central conductors 3a and 3b as a conducting path; and the insulators (the hatched areas in FIG. 1) made of an insulating material, surrounding the central conductors 3a and 3b, and placed across the inside and outside of the tank 1. Furthermore, the bushings 4a and 4b are placed at the same distance from the current interruption unit 2.

Furthermore, the capacitors 5a and 5b are buried in the insulators of the bushings 4a and 4b, then one ends of the capacitors 5a and 5b are connected to the central conductors 3a and 3b, respectively, and then the other ends of the capacitors 5a and 5b are connected to the tank 1 at the ground potential.

Figure 2:
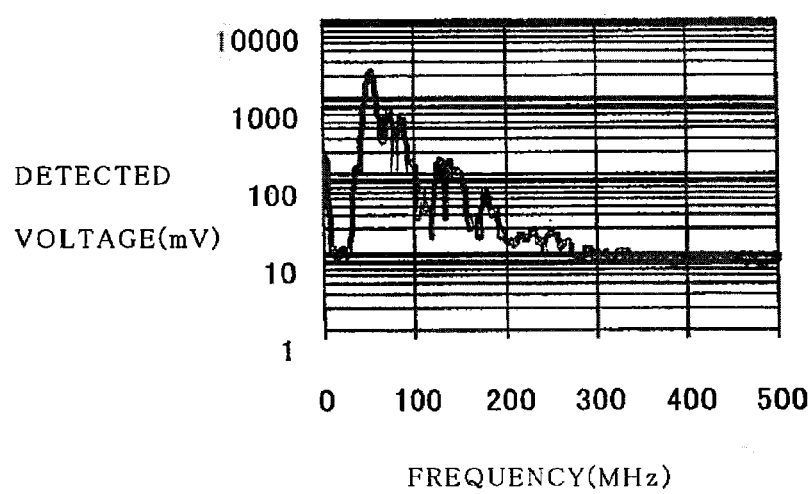
FIG. 2 A diagram showing an example of the frequency spectrum of a discharge signal in a vacuum in the tank-type circuit breaker.

The capacitance of the capacitors 5a and 5b (the first and second low-pass filters) is set so that a propagation signal with a frequency higher than the frequency of discharge waveform will not be passed, based on the frequency component of the discharge waveform inside the tank shown in FIG. 2. As an example, placing a capacitor of a few nF can attenuate a propagation signal of several tens of MHz or higher to about one tenth or smaller. FIG. 2 shows an example of the frequency spectrum of a discharge signal in a vacuum valve of a tank-type circuit breaker.

Figure 3:
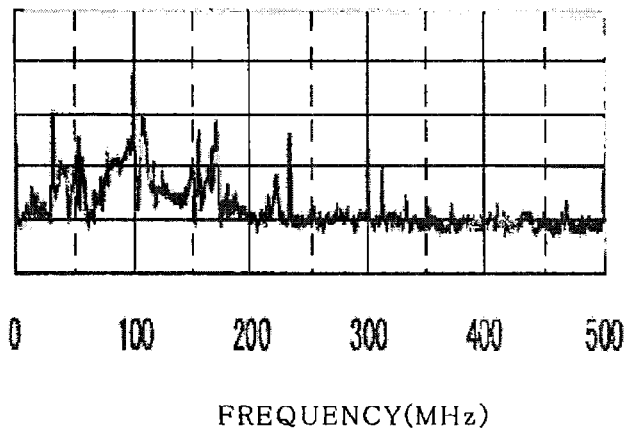
FIG. 3 A diagram showing an example of the frequency spectrum of a discharge signal in a gas in the tank-type circuit breaker.

Furthermore, FIG. 3 shows an example of the frequency spectrum of a discharge signal in a gas of a tank-type circuit breaker. Referring to FIG. 3, even with a discharge in the gas, the frequency band caused by the discharge is almost similar to that shown in FIG. 2, so the invention is applicable irrespective of the type of insulating gas as an insulating medium.

Furthermore, the antenna 7 is placed in the tank 1. Here, within the frequency band of the discharge waveform, the receiving sensitivity of the antenna 7 is preferably high in a frequency band higher than a lower frequency band in which the capacitors 5a and 5b start to attenuate a signal. This is because, for example, a low-pass filter that attenuates a signal of 100 MHz to one tenth attenuates a signal of 200 MHz to one twentieth, thus the amount of attenuation tends to increase as the frequency increases, and, the higher the frequency band is, the larger the amount of attenuation can be and then the more accurately a discharge inside the tank can be detected.

The discharge signal received by the antenna 7 is input to a discharge detection circuit 10 through a signal line. The output signal of the discharge detection circuit 10 is input to a calculation circuit 11 through a signal line. The calculation circuit 11 performs arithmetic processing of calculating the number of discharges occurring in a certain duration and the intensity of a discharge signal, and, if a calculated value is more than or equal to a threshold, issues an alarm indicating that insufficient vacuum or the like is occurring. Note that the discharge detection circuit 10 and the calculation circuit 11 are collectively referred to as the discharge detection unit 20.

Here, for example, a filter placed in the discharge detection circuit 10 attenuates a frequency component of the signal received by the antenna 7 out of the frequency band of the discharge waveform and, in contrast, passes a signal within the frequency band of the discharge waveform attenuated by the capacitors 5a and 5b.

When an insulation-related problem occurs in the tank 1, for example, when a deposition of foreign metallic particles onto a high electric field portion of the current interruption unit 2, an insufficient interface insulation of a solid insulating material, a foreign matter in the tank 1, a vacuum degree deterioration (when the current interruption unit 2 is a vacuum valve) or the like occurs, a partial discharge (internal discharge) may occur to radiate an electromagnetic wave near the current interruption unit 2.

This electromagnetic wave caused by the internal discharge propagates to the antenna 7. Then, the antenna 7 converts the electromagnetic wave into a discharge signal. Then, the discharge detection circuit 10 attenuates a frequency component of the discharge signal out of the frequency band of the discharge waveform. Then, the partially attenuated discharge signal is input to the calculation circuit 11.

On the other hand, when a discharge outside the tank 1 (external discharge) occurs, a signal caused by the external discharge flows through the capacitors 5a and 5b into the tank 1 side at the ground potential to be attenuated and does not propagate to the antenna 7. To be precise, the external discharge signal attenuated by the capacitors 5a and 5b propagates to the antenna 7 side, but its intensity is reduced to, for example, one tenth or smaller, which has a low impact. Thus, the antenna 7 receives only a discharge inside the tank 1 (internal discharge).

Since the low-pass filter effect of the capacitors 5a and 5b prevents the discharge outside the tank 1 from propagating to within the tank 1, a discharge signal received by the antenna 7 in the tank 1 can be easily determined to be caused by a discharge inside the tank 1, which can prevent the discharge detection unit 20 from recognizing a foreign noise as an internal discharge by mistake.

Here, for example, with a low-pass filter that attenuates a signal of 100 MHz or higher to one tenth or smaller placed, when a signal of 100 MHz and 100 mV propagates from the outside of the tank 1, the reception level at the antenna 7 will be 10 mV or smaller. On the other hand, the reception level of a discharge inside the tank will be 100 mV or so. In this case, if a signal of 100 MHz and 50 mV (an example of threshold) or larger is received by the antenna 7, it will be determined to be a discharge inside the tank. Note that, needless to say, the discharge frequency, the signal intensity and the threshold varies depending on the characteristics of the filter (low-pass filter) and the antenna.

Furthermore, as shown in FIG. 2 in the above, the discharge waveform includes a frequency component having a wide frequency band of several MHz to several hundred MHz, so the frequency band to be attenuated by a low-pass filter such as the capacitors 5a and 5b of the invention needs to be set to lower than or equal to a maximum frequency of the discharged waveform. Based on this, in the invention, placing in the tank 1 the antenna 7 having a sensitivity to a frequency band attenuated by the low-pass filter can eliminate an effect of a propagation noise from the outside and improve the sensitivity to a discharge inside the tank.

In the above description, the bushings 4a and 4b are placed at the same distance from the current interruption unit 2. However, the embodiment is not limited to this. The bushings 4a and 4b may be placed at different distances from the current interruption unit 2.

Second Embodiment

Figure 4:
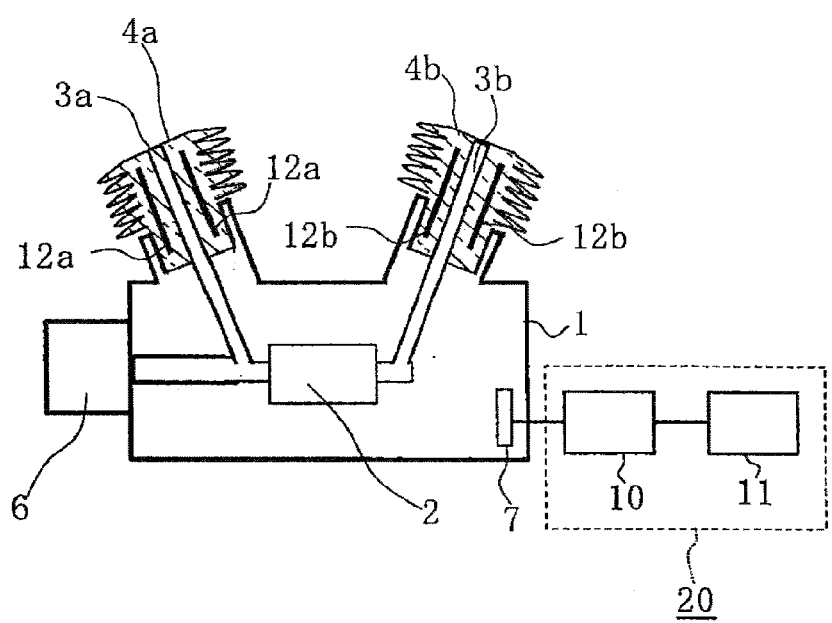
FIG. 4 A side sectional view showing a layout example of a tank in a tank-type circuit breaker of a second embodiment of the invention.

FIG. 4 shows a side sectional view of a tank-type circuit breaker in accordance with a second embodiment of the invention.

In the above-described first embodiment, the capacitors 5a and 5b are connected to the central conductors 3a and 3b as a low-pass filter. On the other hand, in the second embodiment, metal electrodes 12a and 12b are buried in the insulators of bushings 4a and 4b, and the metal electrodes 12a and 12b are connected to a tank 1 to be grounded, thereby forming capacitors using the metal electrodes 12a and 12b and the insulators of the bushings 4a and 4b. Note that the metal electrodes 12a and 12b may be electric field relaxation shields, for example.

For example, assuming that the metal electrodes 12a and 12b have a cylindrical shape with a diameter of ϕ100 and a length of 500 mm surrounding central conductors 3a and 3b, the central conductors 3a and 3b having a diameter of ϕ50, the bushing material (insulator) having a dielectric constant of about 4, a capacitance of about 0.2 nF is provided.

Figure 5:
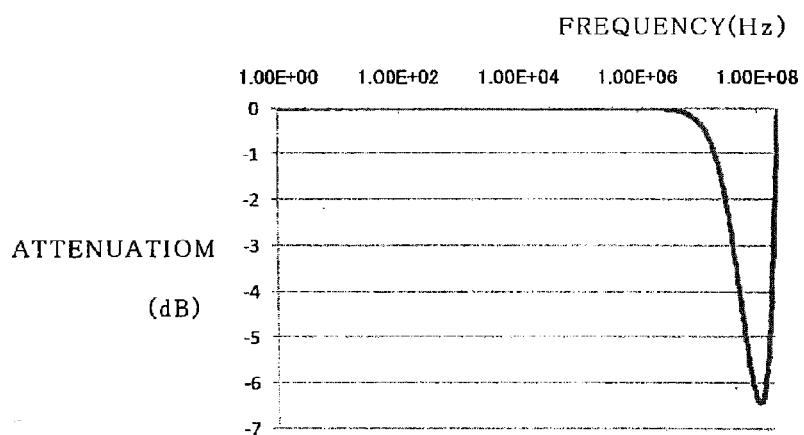
FIG. 5 A diagram showing a calculation result of a filtering effect obtained by an in-bushing electrode structure of the second embodiment of the invention.

In this configuration, the metal electrodes 12a and 12b work as a low-pass filter that allows a signal below 100 MHz band to propagate as shown in FIG. 5. A discharge signal from the outside propagating through the central conductors 3a and 3b propagates through an area surrounded by the metal electrodes 12a and 12b to have the signal intensity in a band of 100 MHz and higher attenuated.

Thus, instead of placing additional capacitors, the metal electrodes 12a and 12b are buried in the bushings 4a and 4b and connected to the tank 1 to provide a filtering effect similar to the effect of using the capacitors.

In this example, the metal electrodes 12a and 12b are buried in the insulators of the bushings 4a and 4b. However, generally, electric field relaxation shields for blurring electric field concentration in the tank 1 may be provided in the insulators of the bushings 4a and 4b, then the electric field relaxation shields may be used as the metal electrodes 12a and 12b to provide a configuration also having the filtering effect. In this configuration, instead of additionally burying the metal electrodes 12a and 12b in the insulators of the bushings 4a and 4b, the electric field relaxation shields can be used to form a low-pass filter.

Third Embodiment

Figure 6:
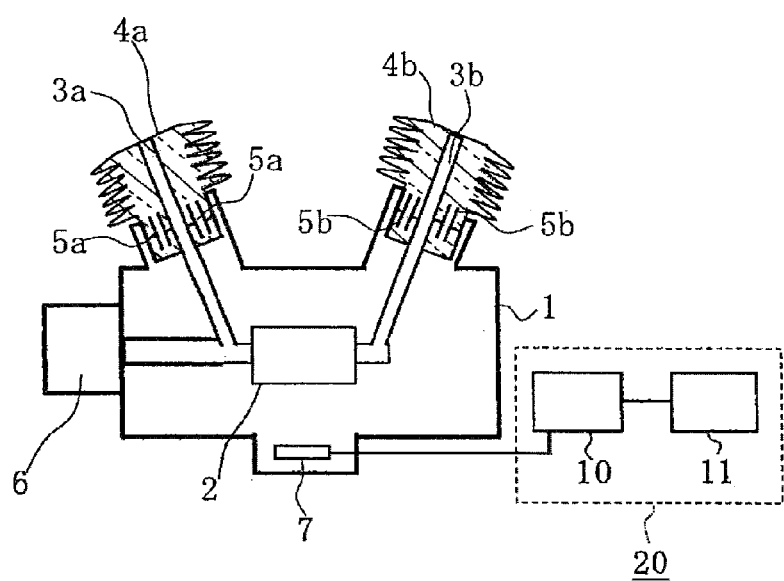
FIG. 6 A side sectional view showing a layout example of an antenna in a tank-type circuit breaker of a third embodiment of the invention.
Figure 7:
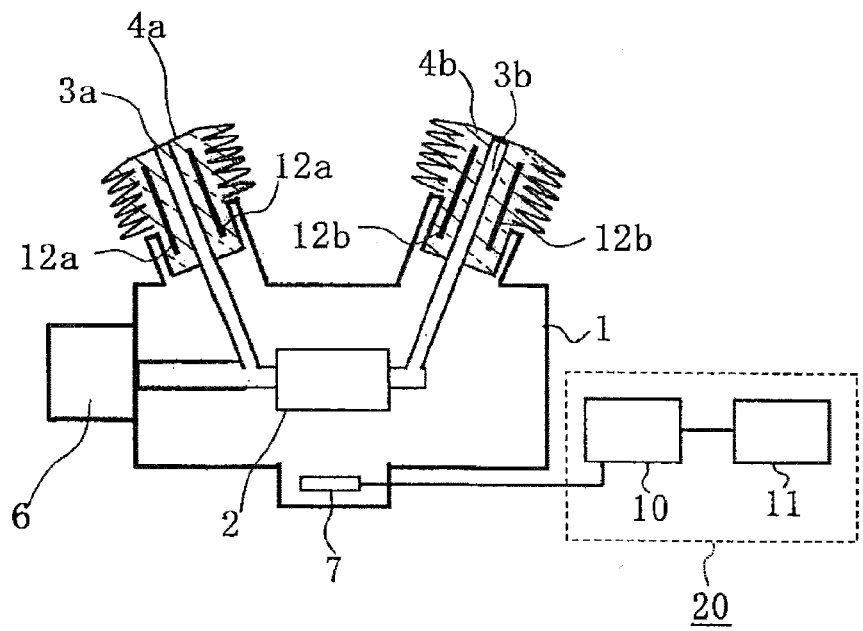
FIG. 7 A side sectional view showing a layout example of an antenna in the tank-type circuit breaker of the third embodiment of the invention.

FIGS. 6 and 7 are schematic diagrams showing a side sectional view of a tank-type circuit breaker in accordance with a third embodiment, in which the longitudinal direction of a tank 1 is in the horizontal direction. In FIGS. 6 and 7, capacitors 5a and 5b or metal electrodes (electric field relaxation shields) 12a and 12b as an low-pass filter are placed at the same distance from a current interruption unit 2. Thus, the low-pass filters are placed symmetrically with respect to the current interruption unit 2. Furthermore, an antenna 7 is placed on the inner periphery of the tank 1 covering the current interruption unit 2 so as to be at the same distance from the two low-pass filter.

In the discharge frequency band, central conductors 3a and 3b are short-circuited to each other through the capacitors 5a and 5b or the metal electrodes 12a and 12b Then, a resonance occurs in the tank 1, in which the current interruption unit 2 at the center between the short-circuited points behaves as an anti-node, the short-circuited points behaving as a node. This means that an electromagnetic wave generated by the resonance reaches its peak around the current interruption unit 2. Thus, the position to place the antenna 7 in the tank 1 is selected to be a position on the inner periphery of the tank 1 covering the current interruption unit 2, and the capacitors 5a and 5b or the metal electrodes 12a and 12b are placed at positions at the same distance from the current interruption unit 2, so that the antenna 7 can effectively receive a peaking discharge signal caused by the resonance.

As illustrated in FIGS. 6 and 7, placing the antenna 7 on the inner periphery of the tank 1 directly below the current interruption unit 2 enables effective receiving of a discharge signal.

Fourth Embodiment

The above described tank-type circuit breakers according to the invention have discharge detection capability of detecting a signal caused by a discharge inside the tank and not detecting a signal caused by a discharge outside the tank. Now, a tank-type circuit breaker in accordance with a fourth embodiment is described below that uses another method to determine whether a discharge has occurred inside or outside a tank, in addition to the above-described discharge detection capability, thereby enabling more reliable determination of whether a discharge has occurred inside or outside the tank.

Figure 8:
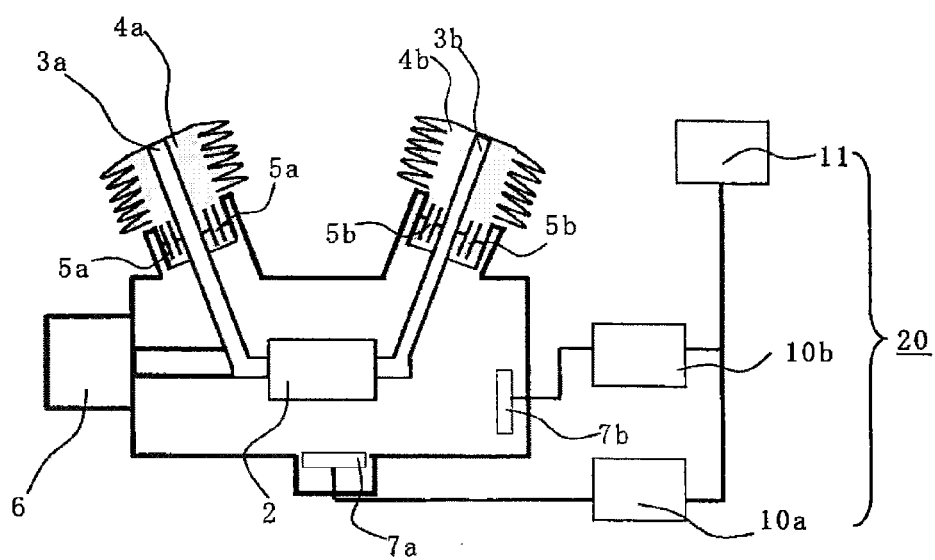
FIG. 8 A side sectional view showing a layout example of an antenna in a tank-type circuit breaker of a fourth embodiment of the invention.

FIG. 8 is a schematic diagram showing a side sectional view of the tank-type circuit breaker in accordance with the fourth embodiment. In the fourth embodiment, a plurality of antennas 7a and 7b are placed in a tank 1. The antennas 7a and 7b are connected to discharge detection circuits 10a and 10b, respectively. A calculation circuit 11 determines whether a discharge has occurred inside or outside the tank 1, depending on the difference between the arrival times of signals output from the discharge detection circuits 10a and 10b. If the difference between the arrival times of signals output from the discharge detection circuits 10*a* and 10*b* is almost zero, it can be determined that the discharge has occurred inside the tank 1. On the other hand, if a difference exists between the arrival times of the output signals, it can be determined that the discharge has occurred outside the tank 1. Specifically, based on the difference between the arrival times of the signals output from the first and second discharge detection circuits 10*a* and 10*b*, if the arrival time difference is more than or equal to a predetermined value, the calculation circuit 11 determines that the discharge has occurred outside the tank 1, and if the arrival time difference is less than the predetermined value, the calculation circuit 11 determines that the discharge has occurred inside the tank 1.

Thus, a signal caused by a discharge outside the tank is caused to flow through the capacitors 5*a* and 5*b* to the tank 1 side at the ground potential to be attenuated, thereby being prevented from propagating to the antenna 7, and furthermore, as shown in FIG. 8, the antenna 7*a* and 7*b* are provided at a plurality of positions in the tank 1 so that whether a discharge has occurred inside or outside the tank can be determined also depending on the difference between the arrival times of discharge signals propagating to the antennas, which enables further accurate detection of a discharge inside the tank. Note that the embodiments of the invention may be freely combined or appropriately modified or omitted within the scope of the invention.

The invention claimed is:

1. A tank-type circuit breaker comprising:
a tank filled with an insulating medium;
a current interruption unit placed in the tank;
first and second bushings connected to the input and output sides of the current interruption unit, respectively, and placed across the outside and inside of the tank;
first and second low-pass filters placed around central conductors of the first and second bushings and electrically connected to a ground of the tank, respectively, for attenuating an external discharge signal in a discharge frequency band propagating from the outside of the tank;
an antenna placed in a sealed region of the tank for receiving a discharge signal in the discharge frequency band; and
a discharge detection unit for performing arithmetic processing on the discharge signal received by the antenna to detect a discharge inside the tank.

2. The tank-type circuit breaker according to claim 1, wherein the first and second low-pass filters are configured using capacitors connected and placed between the central conductors and the tank, respectively.

3. The tank-type circuit breaker according to claim 1, wherein the first and second low-pass filters are configured using metal electrodes buried in the first and second bushings, separated from the central conductors and connected to the tank, respectively.

4. The tank-type circuit breaker according to claim 3, wherein electric field relaxation shields are used for the metal electrodes.

5. The tank-type circuit breaker according to claim 1, wherein the first and second low-pass filters are placed symmetrically with respect to the current interruption unit, and the antenna is placed on the inner periphery of the tank covering the current interruption unit at the same distance from the first and second low-pass filters.

6. The tank-type circuit breaker according to claim 1, comprising
a plurality of the antenna in the tank, wherein the discharge detection unit includes:
discharge detection circuits for detecting the discharge signal received by the antenna;
and a calculation circuit for performing arithmetic processing on the discharge signal, wherein the antennas are connected to the discharge detection circuits, respectively, and wherein, based on the difference between the arrival times of signals output from the plurality of discharge detection circuits, if the arrival time difference is more than or equal to a predetermined value, the calculation circuit determines that the discharge has occurred outside the tank, and if the arrival time difference is less than the predetermined value, the calculation circuit determines that the discharge has occurred inside the tank.

7. The tank-type circuit breaker according to claim 1, wherein the first and second low-pass filters are placed in the insulators around central conductors of the first and second bushings, respectively.

* * * * *